United States Patent

Hatano et al.

Patent Number: 6,002,167
Date of Patent: Dec. 14, 1999

[54] SEMICONDUCTOR DEVICE HAVING LEAD ON CHIP STRUCTURE

[75] Inventors: Kazuhisa Hatano; Tatsuya Ohtaka; Takaharu Yonemoto; Osamu Yoshioka, all of Ibaraki-ken; Gen Murakami, Tokyo, all of Japan

[73] Assignee: Hitachi Cable, Ltd., Tokyo, Japan

[21] Appl. No.: 08/710,658

[22] Filed: Sep. 20, 1996

[30] Foreign Application Priority Data

Sep. 22, 1995 [JP] Japan .................................. 7-244205
Mar. 7, 1996 [JP] Japan .................................. 8-049694

[51] Int. Cl.$^6$ .......................... H01L 23/495; H01L 23/48; H01L 23/52
[52] U.S. Cl. .......................... 257/696; 257/723; 257/673; 257/666; 257/686; 257/730
[58] Field of Search .......................... 257/696, 693, 257/646, 723, 730, 686, 666, 673

[56] References Cited

U.S. PATENT DOCUMENTS

| | | | |
|---|---|---|---|
| 5,530,286 | 6/1996 | Murakami et al. | 257/693 |
| 5,554,886 | 9/1996 | Song | 257/686 |
| 5,760,471 | 6/1998 | Fujisawa et al. | 257/686 |

FOREIGN PATENT DOCUMENTS

| | | | |
|---|---|---|---|
| 60-194548 | 10/1985 | Japan | 257/686 |
| 61-101067 | 5/1986 | Japan | 257/686 |
| 5-46045 | 6/1993 | Japan . | |
| 6-29429 | 2/1994 | Japan | 257/696 |
| 6-132453 | 5/1994 | Japan . | |

*Primary Examiner*—Alexander Oscar Williams
*Attorney, Agent, or Firm*—McDermott, Will & Emery

[57] ABSTRACT

A semiconductor device has a semi-conductor chip 1 having bonding pads 2 thereon, conductive leads 4, each of which comprises an inner lead 41 and an outer lead 42, insulating adhesive tapes 3 by which each of the inner leads 41 of the leads 4 is stuck to the surface 1a of the semiconductor chip 1, bonding wires 6 by which each of the leads 4 is electrically connected to each corresponding bonding pad 2. The semiconductor chip 1, bonding pad 2, adhesive tapes 3, inner leads 41, and bonding wires 6 are molded by a molding resin 5. The boundary of the inner lead 41 and the outer lead 42 of the lead 4 is bent in S-shape so that there is a step between inner lead 41 and the upper side portion 42a of the outer lead 42 in a certain depth. Then the outer lead 42 protrude out of the molding resin and extend in J-shape. The surface 4a of the upper side portion 42a of the outer lead 42 is higher than the top of the looped bonding wire 6.

9 Claims, 5 Drawing Sheets

SEMICONDUCTOR DEVICE HAVING LEAD ON CHIP STRUCTURE

BACKGROUND OF THE INVENTION

This invention relates to a semiconductor device, and more particularly to, a semiconductor device having a Lead on Chip structure in which conductive leads are mounted on the surface of a semiconductor chip.

According to the demand of high-density packaging of a mass storage memory like a Dynamic Random Access Memory (DRAM), a Lead on Chip (LOC) structure, which allows a relatively large-scale semiconductor chip to be stored in a relatively small package, has been adopted.

A conventional semiconductor device comprises a semiconductor chap having bonding pads thereon, conductive leads, each of which comprises an inner lead and an outer lead, adhesive tapes by which each of the inner leads of the leads are stuck to the surface of the semiconductor chip, bonding wires by which each of the leads are electrically connected to each corresponding bonding pad, and a molding resin by which the semiconductor chip, the inner leads and other parts are molded. Most part of each outer lead protrudes out of the molding resin, and extends in J-shape from both sides thereof toward the back side thereof. The outer leads are used as electrical terminals for connecting the semiconductor chip to other electrical circuits.

Another type of a semiconductor device having a Chip Scale Package (CSP) has been proposed. Such a CSP type semiconductor device comprises a semiconductor chip having bonding pads thereon, conductive leads, each of which comprises an inner lead and an outer lead, a cover film stuck to one plane of the semiconductor chip, so that the bonding pads are exposed through the openings of the cover film. The inner leads, which are aligned radially around the bonding pads, are attached to the cover film. Each inner lead is electrically connected to each corresponding bonding pad by bonding wires. Both side planes of the semiconductor chip, a spacing between the back side of the outer leads and the cover film, and other parts are molded by a molding resin, whereas the other plane of the semiconductor chip is not molded. Each lead is bent in S-shape at the boundary of the inner lead and the outer lead, and the outer lead extends, in parallel along the one plane or the semiconductor chip.

In the first mentioned conventional LOC type semiconductor device, however, there is a disadvantage in that since each lead is not designed to have a step between the inner lead and the outer lead, so that a top portion of each looped bonding wire is positioned above the top surface of each lead. Therefore, the bonding wires are more likely to be given an impact from outside. Thereby, resulting in that the alignment of the looped bonding wires is easily influenced by just a slight shock, then a short-circuit or a disconnection of the bonding wire is likely to occur. Therefore, its handling is more difficult.

Another disadvantage of the first mentioned conventional semiconductor device is that stacking semiconductor devices is impossible since each outer lead is not exposed on the surface of the semiconductor device. Therefore, the semiconductor device is not applicable to such multi-stacked structure. Such disadvantage is a common one in the second mentioned proposed semiconductor device, because the surface of the outer lead thereof may come into contact with the exposed plane of underlaid semiconductor chip of another semiconductor device directly, when they are stacked.

SUMMARY OF THE INVENTION

Accordingly, it is an object of the invention to provide a semiconductor device which is easy to handle.

It is a further object of the invention to provide a semiconductor device which is suitable for multi-stacked structure, According to the first feature of the invention, a semiconductor device comprises:

a semiconductor chip having bonding pads thereon;

conductive leads, each of which comprises an inner lead and an outer lead;

insulating adhesive materials by which each of the inner leads of the leads is stuck to the surface of the semiconductor chip;

bonding wires by which each of the leads is electrically connected to each corresponding bonding pad; and a resin by which at least said bonding pad, inner leads, and bonding wires are set; wherein the boundary of the inner lead and the outer lead of the lead is provided with a step so that the inner lead is lower than the upper side portion of the outer lead in a certain depth; the outer lead protruding out of the surface of the resin and extending toward the back side of the semiconductor chip; and the surface of the upper side portion of the outer lead being higher than the top of the looped bonding wire.

According to the second feature of the invention, a semiconductor device, comprises:

a semiconductor chip having bonding pads thereon;

conductive leads, each or which comprises an inner lead and an outer lead;

first insulating adhesive materials by which each of the inner leads of the leads is stuck to the surface of the semiconductor chit;

bonding wires by which each of the leads is electrically connected to the corresponding bonding pad;

a resin by which at least the bonding pad, inner leads, and bonding wires are set, the outer lead protruding out of the surface of said resin and extending toward the back side of the semiconductor chip; and second insulating adhesive materials attached to at least the back side of a back side portion of each outer lead, the second insulating adhesive materials being disposed across from the back side of the semiconductor chip.

BRIEF DESCRIPTION OF THE DRAWINGS

The invention will be explained in more detailed in conjunction with the appended drawings, wherein.

DESCRIPTION OF THE PREFERRED EMBODIMENTS

Before explaining a semiconductor device in the first preferred embodiment, the aforementioned conventional semiconductor device and the proposed one will be explained in FIGS. 1 and 2.

Figure 1:
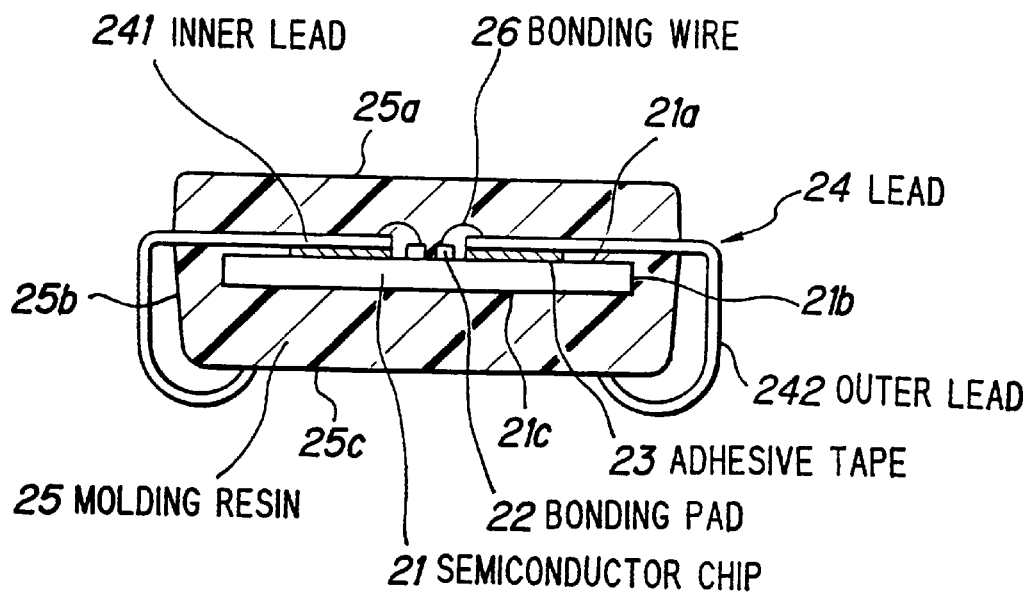
FIG. 1 is a cross-sectional view showing a conventional conventional semiconductor device.

FIG. 1 shows the conventional semiconductor device. The semiconductor device comprises a semiconductor chip 21 having bonding pads 22 thereon, conductive leads 24, each of which comprises an inner lead 241 and an outer lead 242, adhesive tapes 23 by which each of the inner leads 241 of the leads 24 is stuck to the surface 21a of the semiconductor chip 21, bonding wires 26 by which each of the leads 24 is electrically connected to each corresponding bonding pad 22, and a molding resin 25 by which the semiconductor chip 21, bonding pad 22, adhesive tapes 23, inner leads 241, and bonding wires 26 are molded. Only most part of each outer lead 242 protrudes out of the molding resin 25, and extend in J-shape from both sides 25b of the molding resin 25 toward the back side 25c thereof.

In the conventional semiconductor device, as mention above however, there is a disadvantage in that each lead 24 is not designed to have a step between the inner lead 241 and the cuter lead 242, so that a top portion of each looped bonding wire 26 extrudes above the top surface of each lead 24. Therefore, the bonding wires 26 are more likely to be given an impact from outside. Thereby, resulting in that the alignment of the looped bonding wires 26 is easily influenced by just a slight shock, then a defect of electrical connection between each lead 24 and the corresponding bonding pad 22, such as a short-circuit or a disconnection of the bonding wire 26 is likely to occur. Therefore, its handling is more difficult.

Another disadvantage of the conventional semiconductor device is that stacking semiconductor devices is impossible since each outer lead 242 is not exposed on the surface of the semiconductor device. Therefore, the semiconductor device is not applicable to such multi-stacked structure.

Figure 2:
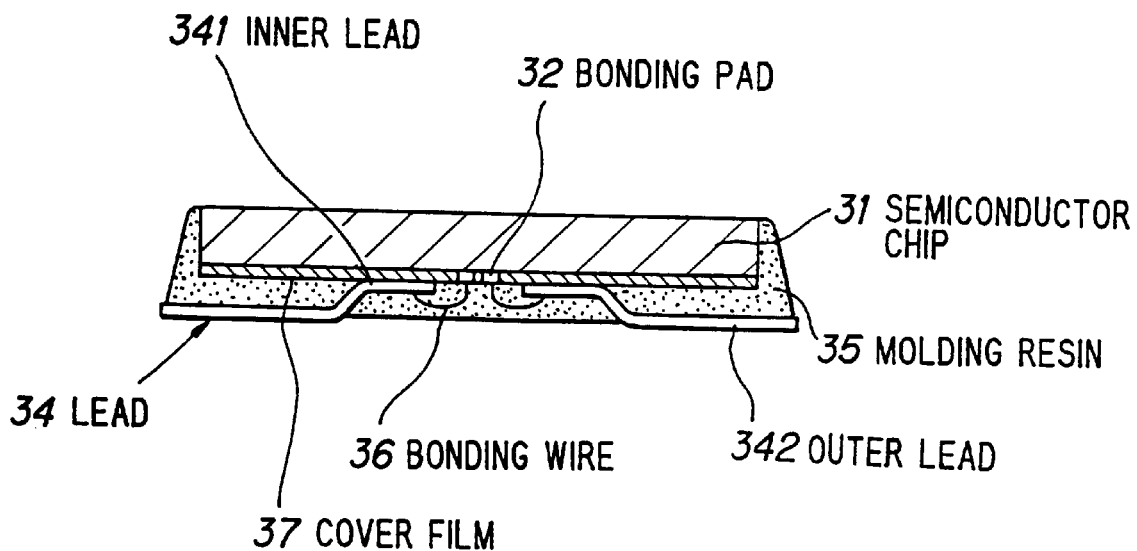
FIG. 2 is a view similar to FIG. 1, but showing a proposed semiconductor device of background art.

FIG. 2 shows a proposed CSP type semiconductor device. The semiconductor device comprises a semiconductor chip 31 having bonding pads 32 thereon, conductive leads 34, each of which comprises an inner lead 341 and an outer lead 342, a cover film 37 adhesively stuck to one plane of the semiconductor chip 31, so that the bonding pads 32 are exposed through the cover film 37. The inner leads 341, which are aligned radially around the bonding pads 32, are attached to the cover film 37. Each lead 34 is electrically connected to each corresponding bonding pad 36 by bonding wires 36. Then, both side planes of the semiconductor chip 31, bonding pads 32, a spacing between the back side of the outer leads 342 and the cover film 37, bonding wire 36 are molded by a molding resin 35. Whereas the other plane of the semiconductor chip 31 is not molded by the molding resin 35. Each lead 34 is bend in S-shape and each outer lead 341 extends in parallel along the one plane of the semiconductor chip 31 (i.e. cover film 37).

The proposed semiconductor device still has similar disadvantage to the aforementioned conventional one, which is the impossibility of multi-stacked structure. Since each outer lead 342 is not exposed on the other side (surface) of the semiconductor device, many semiconductor devices having the same structure are not able to be stacked in thickness direction.

Next, a semiconductor device in the first preferred embodiment will be explained in FIG. 3. The semiconductor device comprises a semiconductor chip 1 having bonding pads 2 thereon in the center thereof, conductive leads 4, each of which comprises an inner lead 41 and an outer lead 42, insulating adhesive tapes 3 by which each of the inner leads 41 of the leads 4 is stuck to the surface 1a of the semiconductor chip 1, bonding wires 6 by which each of the leads 4 is electrically connected to each corresponding bonding pad 2, and a molding resin 5 by which the semiconductor chip 1, bonding pad 2, adhesive tapes 3, inner leads 41, and bonding wires 6 are molded.

But in the embodiment, the boundary of the inner lead 41 and the outer lead 42 of the lead 4 is bent in S-shape so that there is a step between inner lead 41 (lower step) and the upper side portion 42a (upper step) of the cuter lead 42 in a certain depth, The upper side portion 42a, the side portion 42b and the back side portion 42c of the outer lead 42 protrude out of the molding resin and extend in J-shape. Furthermore, the top of the looped bonding wire 6, which is molded in molding resin 5, is lower than the surface 4a of the upper side portion 42a of the outer lead 42. That is to say, the surface 4a of the upper side portion 42a of the outer lead 42 is higher than the top of the looped bonding wire 6.

In order to fabricate the semiconductor device in the embodiment, each inner lead 41 of the lead 4 is bent by down-set process so that is has a S-shaped bend (step) at the boundary of the inner lead 41 and the outer lead 42. Then, the inner lead 41 is stuck by the both-sides insulating adhesive tape 3 to the surface 1a of the semiconductor chip 1 where the corresponding bonding pad 2, which is to be connected to the inner lead 41, is adjacent to. The tip portion of the inner lead 41 is connected to the corresponding bonding pad 2 by the bonding wire 6 of loop-shape. After that, the outside of the semiconductor chip 1 and other parts including the bonding pads 2, adhesive tapes 3 and the inner leads 4, but except for the surface 4a of the upper side portion 42a of the outer lead 41, and both side and back side portions 42b, 42c of the outer lead 42, are molded by the molding resin 5. That is to say, the surface 4a of the upper side portion 42a of the outer lead 41, and both side and back side portions 42b, 42c of the outer lead 42 protrude out of the molding resin 5. Next, each lead 4 is removed from a dam bar (not shown) at the end of the outer lead 41, and the outer lead 42 of the lead is bent along the surface 4a through side plane 5b and the back side 5c of the molding resin 5 so that it makes a J-shaped outer lead 42 shown in FIG. 3. In this case, the back side portion 42c of the outer lead 42 is electrically insulated from the back side 1c of the semiconductor chip 1 by the back side portion 5c of the molding resin 5.

According to the first embodiment, as the top portion of the looped bonding wire 6 is lower than the surface 4a of the outer lead 42 (lead 4), any external impact affected after molding is relaxed by the upper side portion 42a of the cuter lead 42. Then the alignment of the looped bonding wires is hardly influenced by a shock, then its handling is improved. As a result, a short-circuit or a disconnection of the bonding wire is hardly occur, even if the semiconductor device is handled by an automatic handler (not shown), which tends to give impact to the device. Further more, since the upper side portion 42a and the back side portion 42c of the outer lead 42 protrude out of the molding resin 5, external circuits like printed circuit boards are easily connected to both surface and back side of the semiconductor device.

Figure 3:
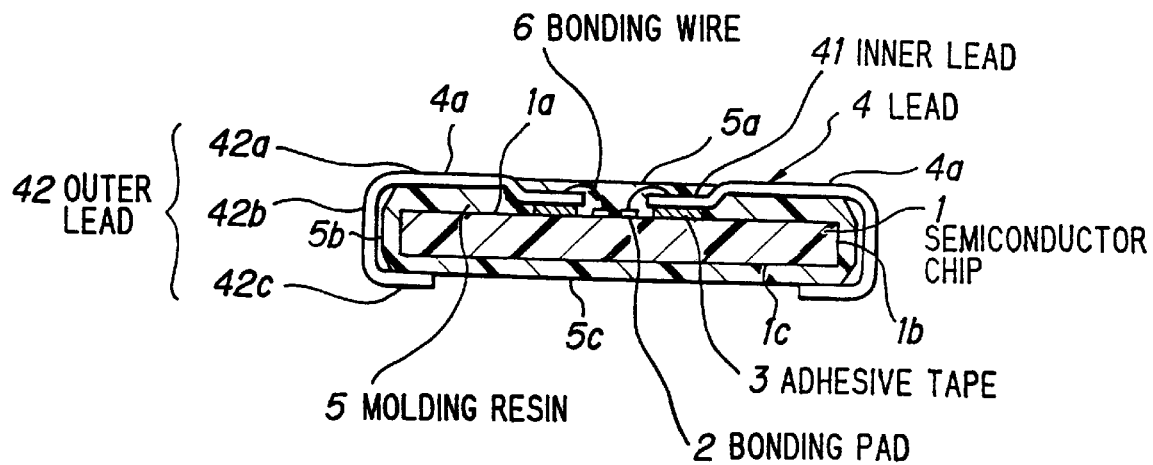
FIG. 3 is a view similar to FIG. 2, but showing a semiconductor device in a first preferred embodiment according to the invention.
Figure 4:
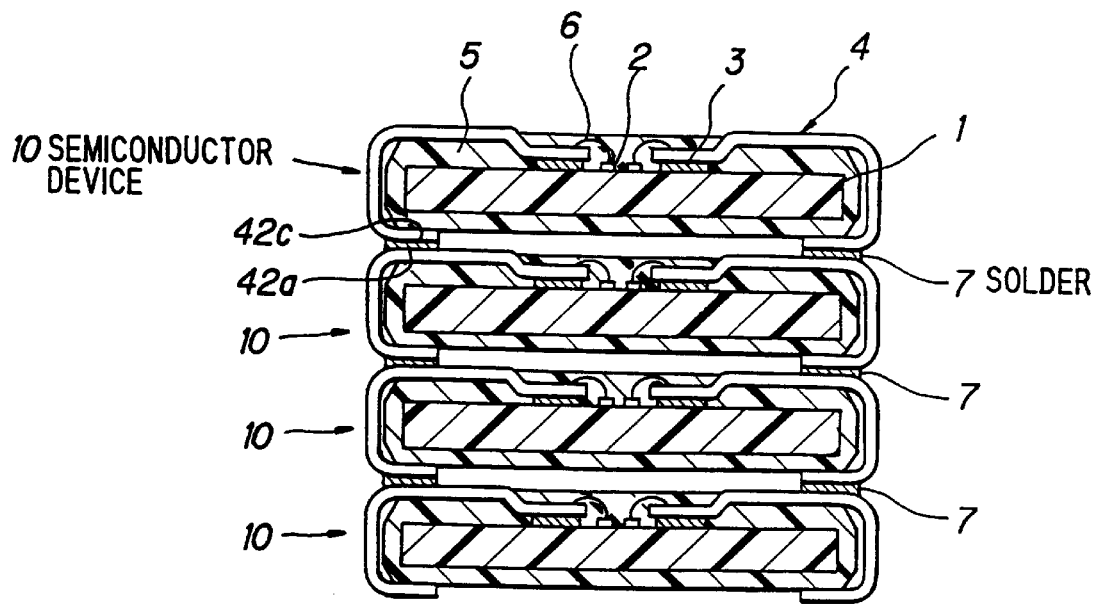
FIG. 4 is a cross-sectional view showing semiconductor devices having a multi-staked structure in a second preferred embodiment according to the invention.

FIG. 4 shows semiconductor devices having a multi-stacked structure in a second preferred embodiment according to the invention, wherein like parts are indicated by like reference numerals as used in FIG. 3. In the embodiment, four semiconductor devices 10 having the same structure shown in FIG. 3 are stacked in series. The back side portion 42c of the outer lead 42 of an upper semiconductor device 10 is electrically connected to the upper side portion 42a of outer lead 42 of a lower semiconductor device 10 by a solder 7. In this case, since each outer lead 42 protrudes out of the molding resin 5, the alignment of outer reads 42 of both upper and lover semiconductor devices for soldering is easier. In the embodiment, as a whole, the function, capacity (mass memory storage), and circuit scale of the semiconductor devices can be increased and the packaging density per unit projection area can be improved.

Figure 5:
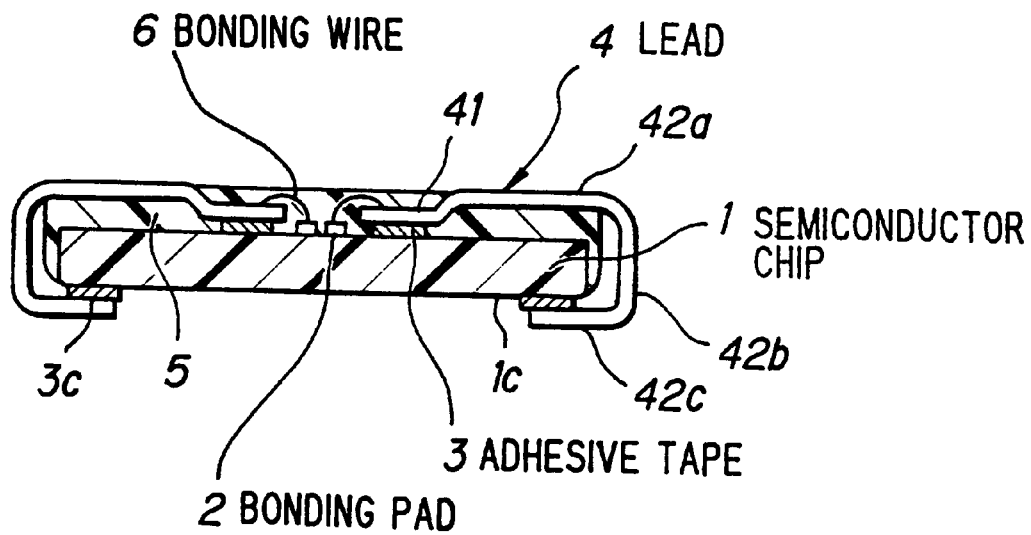
FIG. 5 is a view similar to FIG. 3, but showing a semiconductor device in a third preferred embodiment according to the invention.

FIG. 5 shows a semiconductor device in a third preferred embodiment according to the invention, wherein like parts are indicated by like reference numerals as used in FIG. 3. Whereas the back side 1c of the semiconductor chip 1 is covered by molding resin 5 in first embodiment, the thickness of the semiconductor device is rather thicker. In the third embodiment, the back side 1c of the semiconductor chip 1 is exposed (not covered by the molding resin 5) so that the thickness of the semiconductor device 1 becomes thinner. Adhesive tapes 3c are used for sticking, the back side portion 42c of the outer lead 42 to the back side 1c of the semiconductor chip 1 and securing the electrical insulation between them. To fabricate this semiconductor device, the size of a metal mold (not shown) and the alignment of a dam bar (not shown) attached to the lead 4 are approximately adjusted to the size of the semiconductor chip 1. In that manner, a melting molding resin (not shown) is not supplied to the back side 1c of the semiconductor chip 1. Then, the both-sides adhesive tapes are attached to the back side 1c of the semiconductor chip where the back side portion 42c of the outer lead 42 is to be attached.

Figure 6:
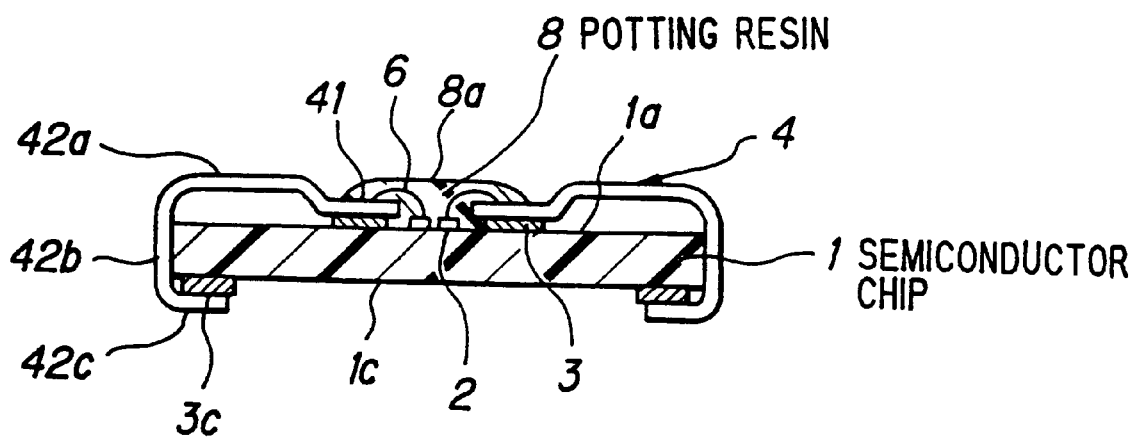
FIG. 6 is a view similar to FIG. 5, but showing a semiconductor device in a fourth preferred embodiment according to the invention.

FIG. 6 shows a semiconductor chip in a fourth preferred embodiment according to the invention, wherein like parts are indicated by like reference numerals as used in FIG. 5. In the first through third embodiment, since the semiconductor chip 1 is molded by the molding resin 5, it is essential to add a remover material into the molding resin 5 so that the resin does not stick to a metal mold (not shown). Such resin, however, may have weak adhesive characteristics so that water may enter the surface of the semiconductor chip (especially inner lead 41) through the boundary between the lead 4 and the molding resin 5, and corrode it. In the fourth embodiment, a potting resin 8, which does not include such removal material, is potted on a certain area of the surface 1a of a semiconductor chip 1 where bonding pads 2, adhesive tapes 3, inner leads 41, and bonding wires 6 are included. In this case, the top portion 8c of the potting resin is lower than the surface of the upper side portion 42a of the outer lead 42. According to the embodiment, the potting resin, which does not substantially include any removal materials, can improve the adhesive characteristics thereof to the lead 4. Therefore, water molecules may contact neither the surface of the semiconductor chip 1, nor especially inner lead 41, then the reliability of the semiconductor device may be improved. Furthermore, the quantity of resin to be supplied may be decreased.

In the above first through fourth embodiment, the leads of 0.10 mm thickness are used. The depth of downset process is 0.10 mm, the thickness of the adhesive tapes is 0.08 mm, and the distance between the top portion of the looped bonding wires and the surface of the semiconductor chip is less than 0. 26 mm. A layer of adhesive may be used besides the both-sides adhesive tapes. Furthermore, besides downset process, coining or half-etching process to make inner leads of leads thinner than outer leads thereof may be used. Moreover, it is understood that the semiconductor devices shown in FIGS. 5, 6 may be stacked in series to form a multi-stack structure as shown in FIG. 4.

Figure 7:
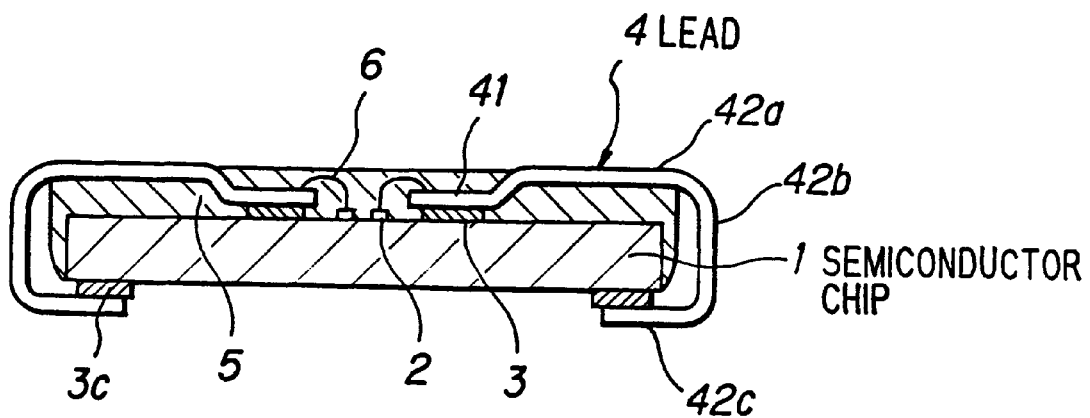
FIG. 7 is a view similar to FIG. 5, but showing a semiconductor device in a fifth preferred embodiment according to the invention.
Figure 8:
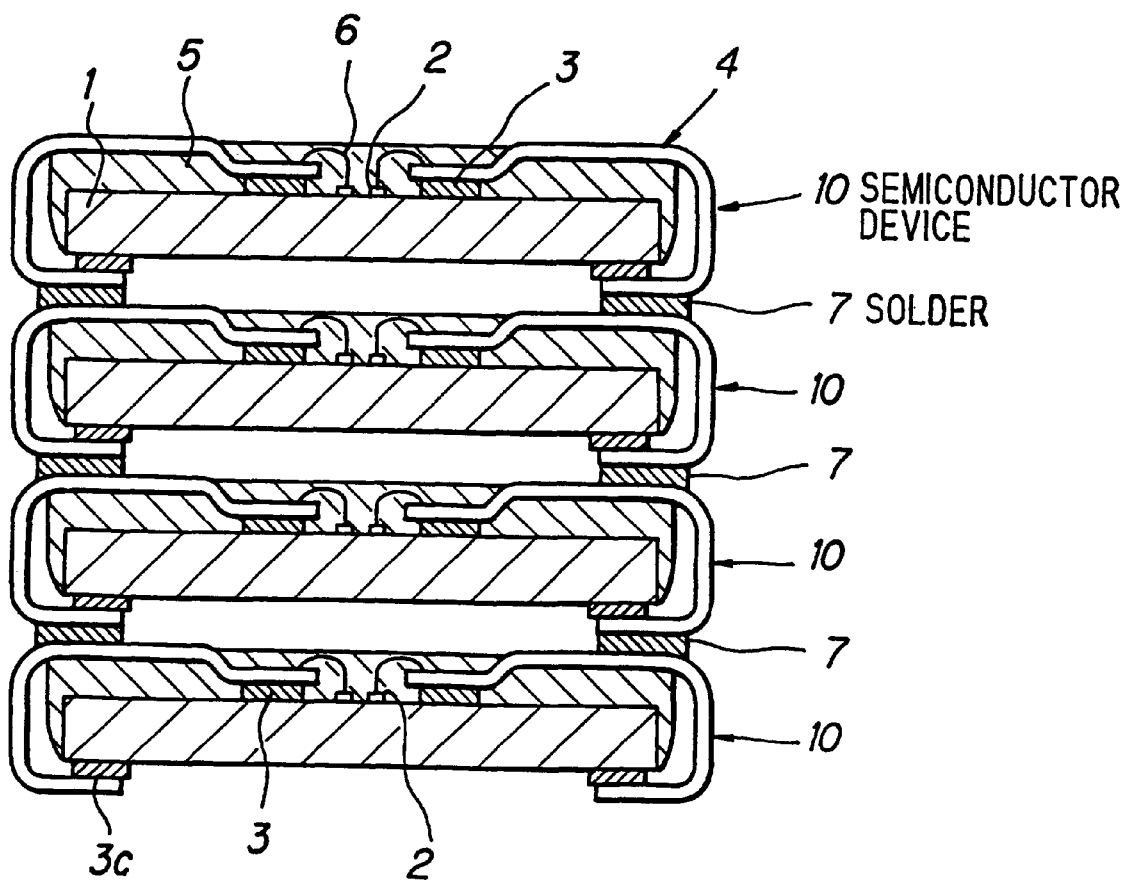
FIG. 8 is a view similar to FIG. 4, but showing semiconductor devices having a multi-stacked structure in a sixth preferred embodiment according to the invention, FIG. 9 a view similar to FIG. 7, but showing a semiconductor device in a seventh preferred embodiment according to the invention.

FIG. 7 shows a semiconductor device in a fifth preferred embodiment according to the invention, wherein like parts are indicated by like reference numerals used in FIG. 5. In the embodiment, each adhesive tape 3c, which is stuck to both back side of semiconductor chip 1 and the back side portion 42c of the outer lead 42, is an insulating tape on both sides of which adhesive materials are applied. In order to fabricate the semiconductor device, flat leads 4 (not shown) having the thickness of 0.1 mm are prepared, and an inner lead 41 of each lead 4 are shifted from an outer lead 42 by 0.1 mm depth by downset process. Next, both-sides adhesive tapes having the thickness of 0.08 mm are stuck to both the back side of the inner lead 41 and the back side of the tip portion of the outer lead 42. Then, semiconductor chip 1 is mounted below the inner leads 41 through the both-side adhesive tapes 3. Next, each inner lead 41 is electrically connected to each corresponding bonding pad 2 by a looped bonding wire 6, the top portion of which is less than 0.26 mm high from the surface of the semiconductor chip 1. After that, the surface and each side plane of the semiconductor chip 1, bonding pads 2, adhesive tapes 3, inner leads 41 and the bonding wires 6 are molded by a molding resin so that the outer lead 42 protrude out of the molding resin 5. Then, each outer lead is cut in certain length and removed from a metal frame (not shown), and bent in J-shape so that the side portion 42b and the back side portion 42c of each outer lead 42 extend along the side plane and the back side of the semiconductor chap 1 with a certain distance therefrom. Finally, the back side portion 42c of the outer lead 42 is pushed against the back side of the semiconductor chip 1, and attached thereto, then the semiconductor device is obtained. In the embodiment, a number of semiconductor devices may be stacked in thickness direction as well as in the second preferred embodiment shown in FIG. 4. FIG. 8 shows such semiconductor devices having a multi-stack structure in a sixth preferred embodiment according to the invention, using four semiconductor devices having the structure shown in FIG. 7.

Figure 9:
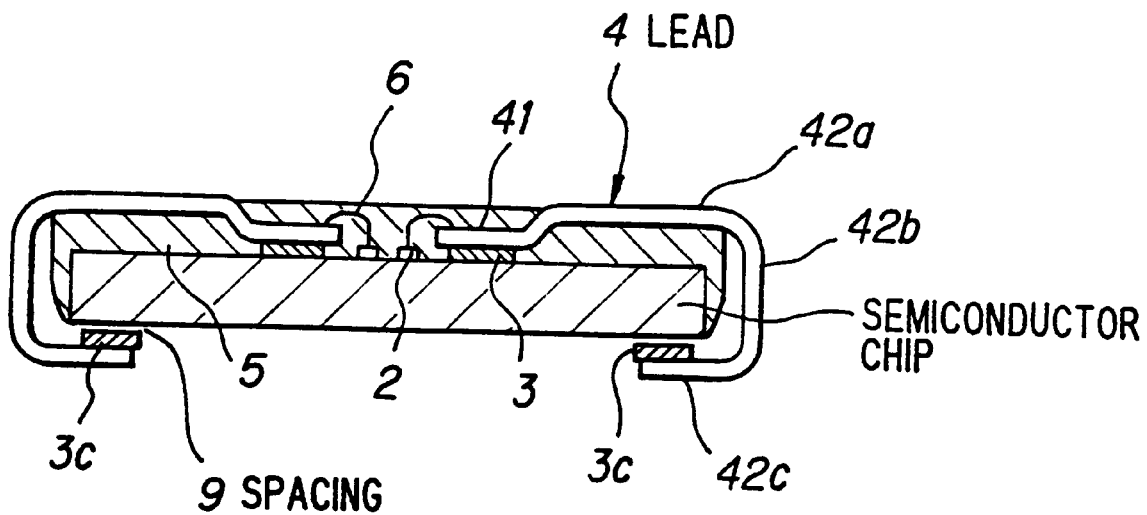

FIG. 9 shows a semiconductor device in a seventh preferred embodiment according to the invention, wherein like parts are indicated by like reference numerals as used in FIG. 7, in the embodiment, there is a spacing between each adhesive tape 3c and the back side of a semiconductor chip 1 for an electrical insulation. If the semiconductor device is Used as a single device, it is not necessary to attach the back side portion 42c of each outer lead 42 to the back side of the semiconductor chip 1. Therefore, in this case, besides both-sides adhesive tapes, insulating tapes having only one adhesive material layer may be used. In the embodiment, a number of semiconductor devices may be stacked in thickness direction as well as in the second and sixth preferred embodiments shown in FIGS. 4 and 5. In this case, since the back side portion 42c of each outer lead 42a is separated from the back side of the semiconductor chip 1, the heat of soldering cannot be transferred thereto. As a result, the soldering between the back side portion 42c of the outer lead 42 of the upper semiconductor device and the upper side portion 42a of the outer lead 42 of the lower semiconductor device may be completed in a shorter time.

Figure 10:
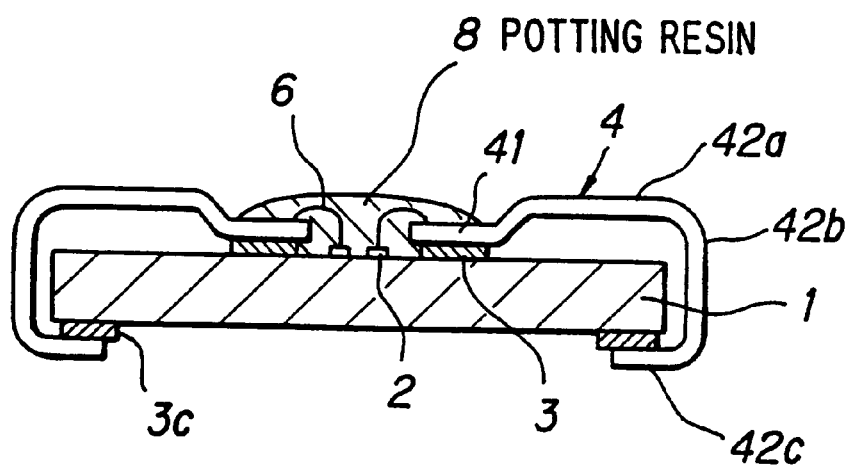
FIG. 10 is a view similar to FIG. 6, but showing a semiconductor device in a eighth preferred embodiment according to the invention.

FIG. 10 shows a semiconductor device in a eighth preferred embodiment, wherein like parts are indicated by like reference numerals as used in FIG. 6. In the embodiment, the difference between the fourth preferred embodiment shown in FIG. 6 is that the side portion 42b of each outer lead 42 is separated form the side plane of the semiconductor chip 1. In the embodiment, as well as in the fourth preferred embodiment, its fabrication becomes easier than that using molding process. Moreover, as each outer lead 42 is not molded or covered by the potting resin 8, it may no be shifted upward from the surface of the semiconductor chip 1. Therefore, the connection among outer leads for multistacked structure becomes more reliable.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A semiconductor device, comprising:

a semiconductor chip having a front surface, a back surface opposing the front surface and bonding pads on the front surface;

conductive leads, each of which comprises an inner lead and an outer lead;

insulating adhesive material by which each of said inner leads of said leads is stuck to the upper surface of said semiconductor chip;

bonding wires by which each of said leads is electrically connected to each corresponding bonding pad; and a resin by which at least said bonding pad, inner leads, and bonding wires are set, wherein the boundary of said inner lead and said outer lead of each lead is provided with a step so that said inner lead is lower than the upper side portion of said outer lead in a certain depth said outer lead protrudes out of the surface of said resin and extends toward the back surface of said semiconductor chip, the surface of said upper side portion of said outer lead is higher than the top of the looped bonding wire, the back surface of the semiconductor chip is exposed from the resin, the outer lead has a portion which is bent on the back surface of the semiconductor chip, and between the portion which is bent on the back surface of the semiconductor chip, and the back surface of the semiconductor chip, there is provided an electrically insulative adhesive or tape.

2. The semiconductor device, according to claim 1, wherein:

said resin is a potting resin which is substantially free from any removal materials.

3. A stack of semiconductor devices being stacked in series, each of said semiconductor devices, comprising:

a semiconductor chip having a front surface, a back surface opposing the front surface and bonding pads on the front surface;

conductive leads, each of which comprises an inner lead and an outer lead;

insulating adhesive material by which each of said inner leads of said leads is stuck to the front surface of said semiconductor chip;

bonding wires by which each of said leads is electrically connected to each corresponding bonding pad; and a resin by which at least said bonding pad, inner leads, and bonding wires are set, wherein the boundary of said inner lead and said outer lead of each lead is provided with a step so that said inner lead is lower than the upper side portion of said outer lead in a certain depth, said outer lead protrudes out of the surface of said resin and extends toward the back surface of said semiconductor chip, the surface of said upper side portion of said outer lead is higher than the top of the looped bonding wire, the back surface of the semiconductor chip is exposed from the resin, the outer lead has a portion which is bent on the back surface of the semiconductor chip, between the portion of the outer lead which is bent on the back surface of the semiconductor chip and the back surface of the semiconductor chip, there is provided an electrically insulative adhesive or tape, and the back side portion of an outer lead of an upper semiconductor device is electrically connected to the upper side portion of an outer lead of a lower semiconductor device.

4. A semiconductor device, comprising:

a semiconductor chip having a front surface, a back surface opposing the front surface and bonding pads on the front surface;

conductive leads, each of which comprises an inner lead and an outer lead;

first insulating adhesive material by which each of said inner leads of said leads is stuck to the front surface of said semiconductor chip;

bonding wires by which each of said leads is electrically connected to each corresponding bonding pad; and a resin by which at least said bonding pad, inner leads, and bonding wires are set, the back surface of the semiconductor chip being exposed from the resin, said outer lead protruding out of the surface of said resin and and having a portion which is bent on the back surface of the semiconductor chip; and second insulating adhesive material attached to at least the back side of the portion of each said outer lead which is bent on the back surface of the semiconductor chip, said second insulating adhesive material being spaced apart from the back surface of said semiconductor chip.

5. A semiconductor device, comprising:

a semiconductor chip having a front surface, a back surface opposing the front surface and bonding pads on the front surface;

conductive leads, each of which comprises an inner lead and an outer lead;

first insulating adhesive material by which each of said inner leads of said leads is stuck to the front surface of said semiconductor chip;

bonding wires by which each of said leads is electrically connected to each corresponding bonding pad; and a resin by which at least said bonding pad, inner leads, and bonding wires are set, the back surface of the semiconductor chip being exposed from the resin, said outer lead protruding out of the surface of said resin and having a portion which is bent on the back surface of the semiconductor chip; and second insulating adhesive material attached to at least the back side of the portion of each said outer lead which is bent on the back surface of the semiconductor chip, said back side portion of each said outer lead which is bent on the back surface of the semiconductor chip being stuck to the back surface of said semiconductor chip by said second insulating adhesive material.

6. The semiconductor device, according to claim 4, wherein said resin is a molding resin covering said bonding pads, first insulating adhesive material, inner leads, bonding wire and semiconductor chip except for the back side thereof.

7. The semiconductor device, according to claim 4, wherein said resin is a potting resin which is substantially free from any removal materials.

8. A stack of semiconductor devices being stacked in series, each of said semiconductor devices comprising:

a semiconductor chip having a front surface, a back surface opposing the front surface and bonding pads on the front surface;

conductive leads, each of which comprises an inner lead and an outer lead;

first insulating adhesive material by which each of said inner leads of said leads is stuck to the front surface of said semiconductor chip;

bonding wires by which each of said leads is electrically connected to each corresponding bonding pad; and a resin by which at least said bonding pad, inner leads, and bonding wires are set, the back surface of the semiconductor chip is exposed from the resin, said outer lead protruding out of the surface of said resin and and having a portion which is bent on the back surface of the semiconductor chip; and second insulating adhesive material attached to at least the back side of the portion of each said outer lead which is bent on the back surface of the semiconductor chip, said second insulating adhesive material being spaced apart from the back side of said semiconductor chip wherein the back side portion of an outer lead of an upper semiconductor device is electrically connected to the upper side portion of an outer lead of a lower semiconductor device.

9. A semiconductor device, comprising:

a semiconductor chip having a front surface, back surface opposing the front surface and bonding pads on the front surface;

a plurality of conductive leads each having an inner lead and outer lead;

a plurality of bonding wires each bonding said inner lead to a corresponding one of said bonding pads; and a resin for sealing at least said plurality of bonding wires, and bonded portions of said inner lead and said corresponding one of said bonding pads, the back surface of the semiconductor chip being exposed from the resin; wherein said outer lead is elongated outside said resin to be across said front surface of said semiconductor chip and has a portion which is bent on the back surface of the semiconductor chip, said portion of the outer lead which is bent on the back surface of the semiconductor chip including an insulating adhesive material attached to at least the back side thereof.

* * * * *